United States Patent
Ahn et al.

(10) Patent No.: US 8,013,455 B2
(45) Date of Patent: Sep. 6, 2011

(54) SEMICONDUCTOR DEVICE HAVING PADS

(75) Inventors: Jeong-Hoon Ahn, Yongin-si (KR);
Heon-Jong Shin, Yongin-si (KR);
Sung-Hoon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 849 days.

(21) Appl. No.: 11/892,318

(22) Filed: Aug. 22, 2007

(65) Prior Publication Data
US 2008/0048319 A1 Feb. 28, 2008

(30) Foreign Application Priority Data
Aug. 22, 2006 (KR) .................. 10-2006-0079548

(51) Int. Cl.
*H01L 23/488* (2006.01)

(52) U.S. Cl. ... 257/786; 257/734; 257/773; 257/E23.01; 257/E23.02; 257/E23.015

(58) Field of Classification Search .................. 257/773, 257/786, E23.01, E23.015, E23.02, 734
See application file for complete search history.

(56) References Cited

U.S. PATENT DOCUMENTS

| 6,781,238 | B2 * | 8/2004 | Nonaka ......................... 257/773 |
| 6,953,997 | B1 * | 10/2005 | Merigot et al. ................ 257/773 |
| 7,071,561 | B2 * | 7/2006 | Chen ............................. 257/758 |
| 2004/0188763 | A1 * | 9/2004 | Taniguchi et al. ............. 257/355 |
| 2006/0091535 | A1 * | 5/2006 | Tsao et al. ..................... 257/734 |
| 2006/0097386 | A1 * | 5/2006 | Ertle et al. ..................... 257/723 |
| 2007/0045837 | A1 * | 3/2007 | Shindo et al. ................. 257/734 |
| 2007/0267755 | A1 * | 11/2007 | Vo et al. ........................ 257/775 |

FOREIGN PATENT DOCUMENTS

| JP | 09-129809 | 5/1997 |
| JP | 2000-164620 | 6/2000 |
| JP | 2001-264391 | 9/2001 |
| JP | 2003-249557 | 9/2003 |
| KR | 1999-0061337 | 7/1999 |

* cited by examiner

*Primary Examiner* — Eugene Lee
*Assistant Examiner* — Peniel M Gumedzoe
(74) *Attorney, Agent, or Firm* — Harness, Dickey & Pierce, P.L.C.

(57) ABSTRACT

A semiconductor device having pads is provided. The semiconductor device includes first pads formed along a first row, and second pads formed along a second row. The first via contact portions extending from the first pads toward the second row, and second via contact portions extending from the second pads toward the first row. The first and second via contact portions are arranged along a third row between the first and second rows.

18 Claims, 6 Drawing Sheets

SEMICONDUCTOR DEVICE HAVING PADS

PRIORITY STATEMENT

This U.S. non-provisional patent application claims priority under 35 U.S.C. §119 from Korean Patent Application No. 2006-79548, filed on Aug. 22, 2006, the contents of which are hereby incorporated by reference in its entirety.

BACKGROUND

1. Field

Example embodiments relate to a semiconductor device. Other example embodiments relate to a semiconductor device having pads electrically connected to an external appliance.

2. Background

Semiconductor devices include pads that electrically connect to external appliances. When packaging semiconductor devices, external terminals may be mounted on the pads through processes such as wire bonding. Recently, manufacturers have been using a chip-size packaging technique to mount ball-type external terminals on the pads. A pad may have a plane area substantially wider than a plane area of single elements (e.g., transistors, capacitors, resistors, etc.) constituting a semiconductor device. Due to the wide plane area of the pads, it may be difficult to manufacture highly-integrated semiconductor devices. In order to address this concern, the conventional art acknowledges a method of forming a pad structure having pads arranged in two rows.

FIG. 1 is a diagram illustrating a plan view of a semiconductor device having a conventional pad structure.

Referring to FIG. 1, a plurality of pads 10 are arranged along an inner row. Another plurality of pads 10 are arranged along an outer row. The pad 10 has a rectangular shape. The pad 10 includes a first area 5 and a second area 7. The first area 5 contacts an external terminal. The second area 7 electrically connects to a lower interconnection 3. A plurality of via plugs 4 pass through an interlayer oxide layer (not shown) disposed (or formed) between the second area 7 and the lower interconnection 3. The via plugs 4 electrically connect the second area 7 to the lower interconnection 3.

The pads 10 are arranged in two rows such that a semiconductor device having the pads 10 may be highly-integrated compared to a semiconductor device having pads arranged in one row. As the semiconductor industry progresses, semiconductor devices are manufactured to perform more functions making higher capacity semiconductor devices more desirable. In order to manufacture a higher capacity device, the number of pads on the semiconductor device is increased. For instance, logical elements (e.g., a central processing unit (CPU)) require about a thousand pads.

SUMMARY

Example embodiments relate to a semiconductor device having pads. Other example embodiments relate to a semiconductor device having pads electrically connected to an external appliance. Other example embodiments relate to a highly-integrated semiconductor device having pads.

Example embodiments provide a semiconductor device that may include an interlayer dielectric layer formed on (or covering) a surface of a substrate, a plurality of first pads arranged on the interlayer dielectric layer along a first row, a plurality of second pads arranged on the interlayer dielectric layer along a second row, a plurality of first via contact portions extending from the first pads toward the second row, a plurality of second via contact portions extending from the second pads toward the first row, at least one first via plug arranged in the interlayer dielectric layer below the first via contact portions such that the at least one first via plug contacts the first via contact portions, and at least one second via plug arranged in the interlayer dielectric layer below the second via contact portions such that the at least one second via plug contacts the second via contact portions.

The first via contact portions and the second via contact via portions may be arranged along a third row between the first row and the second row. According to example embodiments, an interval between adjacent first pads may be equal to, or smaller, than an interval between adjacent via contact portions of the first and second via contact portions.

At least one of the first via contact portions may have a width parallel to the first and second rows. At least one of the first via contact portions may have a width smaller than a width of the first pad wherein the width of the first pad is parallel to the rows. At least one of the second via contact portions may have a width parallel to the rows. At least one of the second via contact portions may have a width smaller than a width of the second pad wherein the width of the second pad is parallel to the rows. The first via contact portions may have identical widths. The second via contact portions may have identical widths.

The first pads and the second pads may include a power pad that supplies a power supply voltage, and a signal pad that receives and/or outputs an electrical signal. One of the first or second via contact portions may be connected to the signal pad. The via contact portions connected to the signal pad have a width smaller than a width of the signal pad wherein the width of the signal pad is parallel to the rows. The width of the via contact portions connected to the signal pad may be parallel to the rows.

The other of the first or second via contact portions may be connected to the power pad. The via contact portions connected to the power pad may have a width that is parallel to the rows. The width of the via contact portions connected to the power pad may be wider than the width of the via contact portions connected to the signal pad. The width of the via contact portions connected to the power pad may be equal to, or smaller than, a width of the power pad wherein the width of the power pad is parallel to the rows.

The first via contact portions and the second via contact portions may be alternately arranged along the third row. The first pads and the second pads may be alternately arranged along the first and second rows in a zigzag manner.

The semiconductor device may include a plurality of first interconnections formed (or disposed) on the substrate and extending below the first via contact portions, and a plurality of second interconnections formed (or disposed) on the substrate and extending below the second via contact portions. The interlayer dielectric layer may be formed on (or covering) the first and second interconnections. The first via plug provided below the first via contact portions may be electrically connected to the first interconnection. The second via plug provided below the second via contact portions may be electrically connected to the second interconnection. The first interconnections and the second interconnections may be formed (or disposed) at an identical height. According to other example embodiments, the first interconnections may be formed (or disposed) at a different height than the second interconnections.

Example embodiments provide a semiconductor device that may include a plurality of first pads arranged on a substrate along a first row, a plurality of second pads arranged on the substrate along a second row, a plurality of first via contact portions extending from the first pads toward the second row, and a plurality of second via contact portions extending from the second pads toward the first row. The first via contact portions and the second via contact portions may be arranged along a third row between the first and second rows. An interval between adjacent first pads may be equal to, or smaller than, an interval between adjacent via contact portions of the first and second via contact portions.

According to example embodiments, an interval between adjacent second pads may be equal to, or smaller than, the interval between adjacent via contact portions of the first and second via contact portions.

BRIEF DESCRIPTION OF THE DRAWINGS

Example embodiments will be more clearly understood from the following detailed description taken in conjunction with the accompanying drawings. FIGS. 1-5 represent non-limiting, example embodiments as described herein.

FIG. 1 is a diagram illustrating a plan view of a semiconductor device having conventional pads.

FIG. 2 is a diagram illustrating a plan view of a semiconductor device having pads according to example embodiments.

FIG. 5 is a diagram illustrating a plan view of a semiconductor device having pads according to example embodiments.

DETAILED DESCRIPTION OF EXAMPLE EMBODIMENTS

Figure 1:
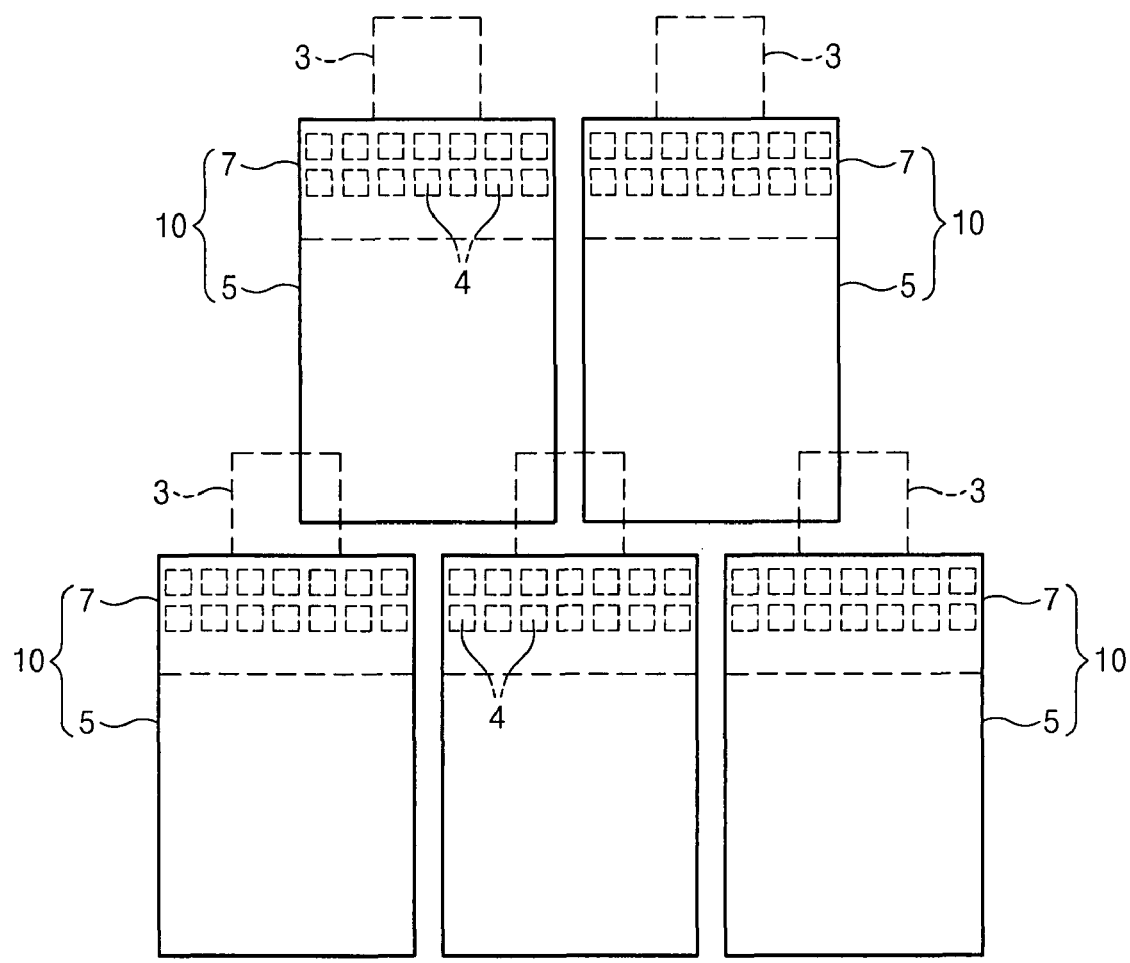

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a semiconductor device. Other example embodiments relate to a semiconductor device having pads electrically connected to an external appliance.

Figure 2:
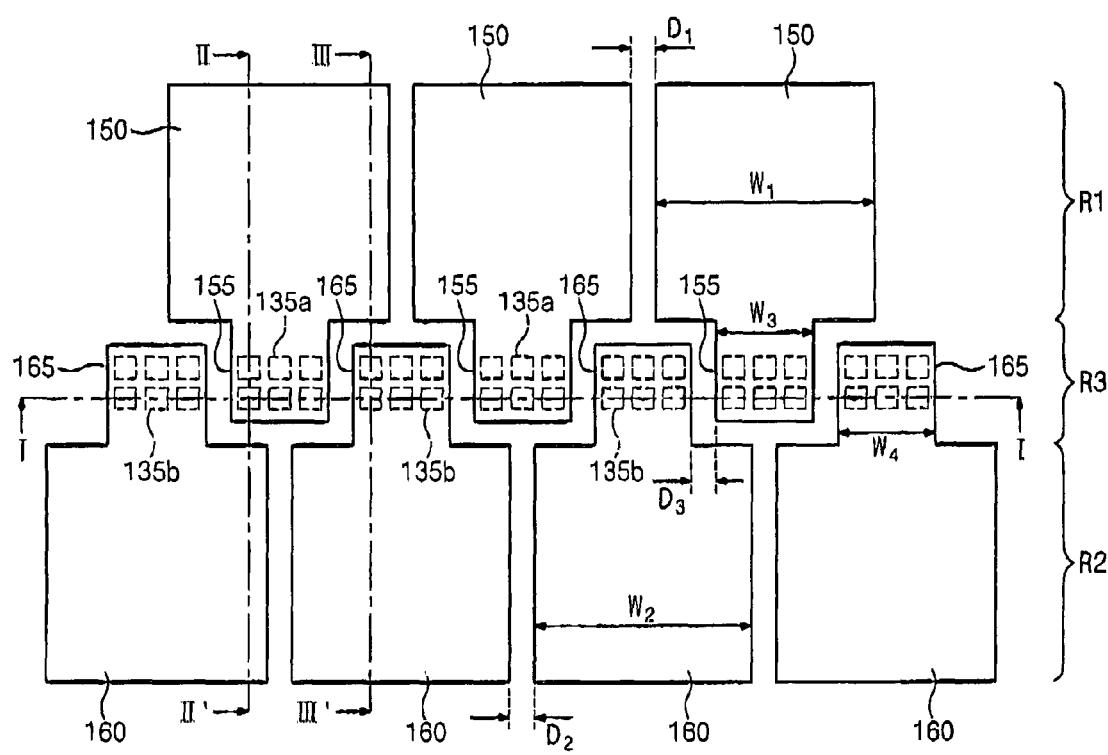
Figure 3A:
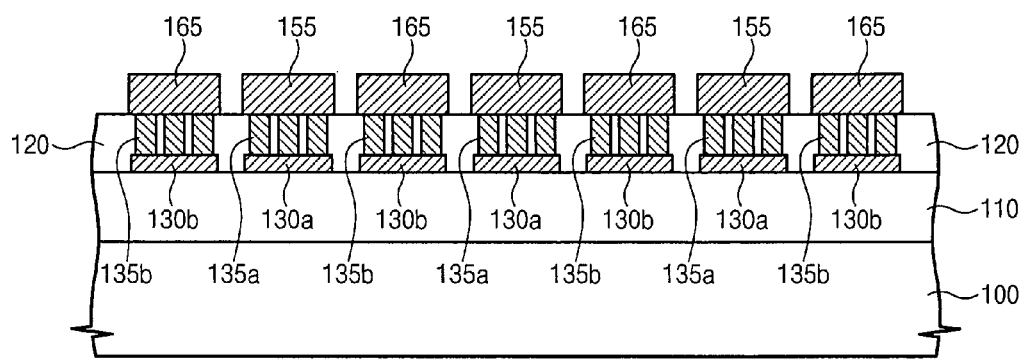
FIGS. 3A, 3B and 3C are diagrams illustrating sectional views taken along lines I-I', II-II', and II-II', respectively, of the semiconductor device shown in FIG. 2.
Figure 3B:
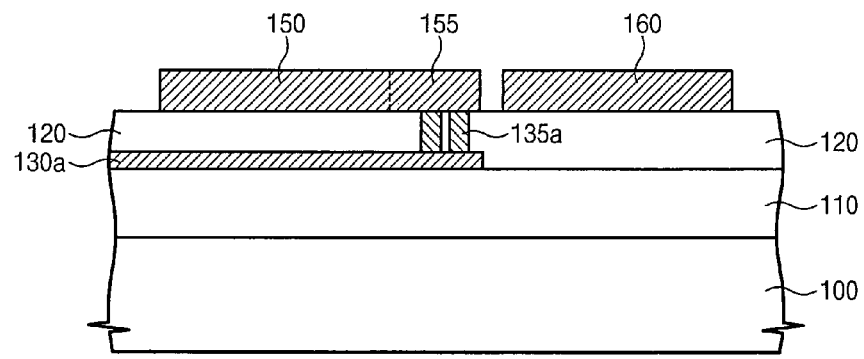
Figure 3C:
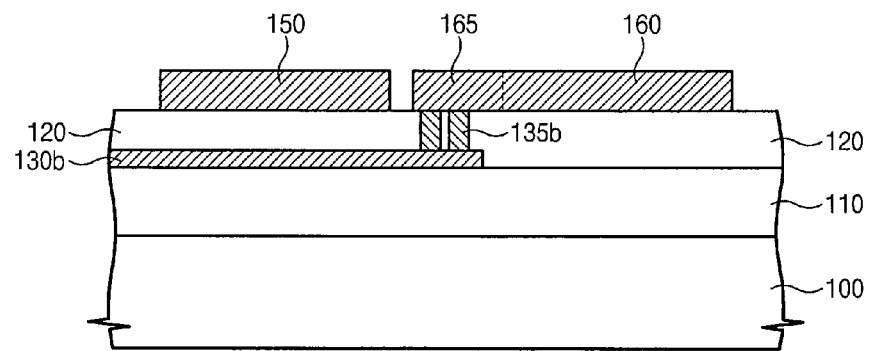

FIG. 2 is a diagram illustrating a plan view of a semiconductor device having pads according to example embodiments. FIGS. 3A to 3C are diagrams illustrating sectional views taken along lines I-I', II-II', and III-III', respectively, of the semiconductor device shown in FIG. 2.

Referring to FIGS. 2, 3A, 3B and 3C, a lower insulating layer 110 may be provided on a semiconductor substrate 100. The lower insulating layer 110 may be in the semiconductor substrate 100. A plurality of first interconnections 130a and a plurality of second interconnections 130b may be formed (or disposed) on the lower insulating layer 110. The first interconnections 130a and the second interconnections 130b may be laterally spaced apart from each other by a desired distance. As shown in FIGS. 2 to 3C, the first interconnections 130a and the second interconnections 130b may be at the same height on the lower insulating layer 110. An interlayer dielectric layer 120 may be formed on (or covering) the surface of the substrate 100 including the first and second interconnections 130a and 130b.

A plurality of first pads 150 may be formed (or disposed) on the interlayer dielectric layer 120. The first pads 150 may be arranged along a first row R1. The first pads 150 may be arranged (or separated) at equal intervals. The first pads 150 may have widths $W_1$ that are parallel to the first row R1. The widths $W_1$ of the first pads 150 may be equal to each other. A plurality of second pads 160 may be formed (or disposed) on the interlayer dielectric layer 120. The second pads 160 may be arranged along a second row R2 parallel to the first row R1. The second pads 160 may be arranged at (or separated by) equal intervals. The second pads 160 have widths $W_2$ that are parallel to the second row R2. The second pads 160 may have equal widths. The first pads 150 and the second pads 160 may be alternately arranged along the first and second rows in a zigzag manner.

A plurality of first via contact portions 155 may each extend toward the second row R2 from the first pads 150. The first via contact portions 155 may extend from a side of the first pads 150 adjacent to the second row R2. A plurality of second via contact portions 165 may each extend toward the first row R1 from the second pads 160. The second via contact portions 165 may extend from a side of the second pads 160 adjacent to the first row R1. The first via contact portions 155 and the second via contact portions 165 may be arranged along a third row R3 between the first row R1 and the second row R2. The first via contact portions 155 and the second via contact portions 165 may be arranged along a same row. The first via contact portions 155 and the second via contact portions 165 may be alternately arranged along the third row R3. The first via contact portions 155 may be formed in a space between the second via contact portions 165. The first via contact portions 155 and the second via contact portions 165 may be arranged at substantially equal intervals. In other example embodiments, the intervals of the adjacent via contact portions 155 and 165 may be different from each other.

The first via contact portions 155 may have a width $W_3$ that is parallel to the first row R1. The second via contact portions 165 may have a width $W_4$ that is parallel to the second row R2. The width $W_3$ of at least one first via contact portions 155 may be narrower than the width $W_1$ of the first pad 150. In other example embodiments, the width $W_3$ of each first via contact portion 155 may be narrower than the width $W_1$ of the first pad 150. The width $W_3$ of the first via contact portions 155 may be identical to each other.

The width $W_4$ of the At least one second via contact portions 165 may be narrower than the width $W_2$ of the second pad 160. In other example, the width $W_4$ of all the second via contact portions 165 may be narrower than the width $W_2$ of the second pad 160. The width $W_4$ of the second via contact portions 165 may be identical to each other. The width $W_3$ of the first via contact portions 155 may be the same as the width $W_4$ of the second via contact portions 165.

The first and second pads 150 and 160 may include a power pad (not shown) supplying a power supply voltage, a ground pad (not shown) supplying a ground voltage, and a signal pad (not shown) receiving and/or outputting an electrical signal. The first and/or second via contact portions may be connected to either of the power pad, the ground pad, and the signal pad. The via contact portions connected to the power pad, the ground pad, and the signal pad may be identical to each other. A plurality of pads may be arranged along an inner row. A plurality of pads may be arranged along an outer row.

Conventionally, a row including regions connected by via plugs of the pads in an inner row may be formed (or disposed) along a different row than a row including regions connected by via plugs of the pads in an outer row. According to example embodiments, the first and second via contact portions 155 and 165 may be arranged along one row. As such, an area occupied by the first and second pads 150 and 160 having the first and second via contact portions 155 and 165 decreases compared to the area occupied by the conventional pads, forming a more highly-integrated semiconductor device.

Adjacent first pads 150 may be spaced apart from each other by a first interval $D_1$. Adjacent second pads 160 may be spaced apart from each other by a second interval $D_2$. Adjacent first and second via contact portions 155 and 165 may be spaced apart from each other by a third interval $D_3$. The first interval $D_1$ may be equal to, or smaller than, the third interval $D_3$. The second interval $D_2$ may be equal to, or smaller than, the third interval $D_3$. The interval $D_1$ between the first pads 150 and the interval $D_2$ between the second pads 160 may be decreased, forming a more highly-integrated semiconductor device.

The first interconnections 130a may extend below the first via contact portions 155. The second interconnections 130b may extend below the second via contact portions 165. The first interconnections 130a and the second interconnections 130b may be arranged in parallel.

At least one first via plug 135a passes through the interlayer dielectric layer 120 between one the first via contact portions 155 and one the first interconnections 130a. The first via plug 135a electrically connects the first via contact portion 155 to the first interconnection 130a. A plurality of the via plugs 135a spaced apart from each other may be formed (or disposed) between one of the first via contact portions 155 and one of the first interconnections 130a. In other example embodiments, one first via plug 135a having a wide surface area may be arranged between one of the first via contact portions 155 and one of the first interconnections 130a.

At least one second via plug 135b passes through the interlayer dielectric layer 120 between one of the second via contact portions 165 and one of the second interconnections 130b. The second via plug 135b electrically connects the second via contact portion 165 to the second interconnection 130b. A plurality of the via plugs 135b spaced apart from each other may be formed (or disposed) between one of the second via contact portions 165 and one of the second interconnections 130b. In other example embodiments, one of the second via plug 135b having a wide surface area may be arranged between one of the second via contact portions 165 and one of the second interconnections 130b.

The first pads 150 may be electrically connected to the first interconnections 130a through the first via contact portions 155. The second pads 160 may be electrically connected to the second interconnections 130b through the second via contact portions 165. The first interconnection 130a may be electrically connected to the first pad 150. The second interconnection 130b may be electrically connected to the second pad 160.

The first and second connections 130a and 130b may be formed by a damascene process. According to other example embodiments, the first and second interconnections 130a and 130b may be formed by a patterning process. The lower insulating layer 110 may include an oxide layer (not shown). The interlayer dielectric layer 120 may include an oxide layer (not shown). The first and second interconnections 130a and 130b may include a metal (e.g., aluminum, aluminum compound, copper or copper compound) having substantially low resistivity. The first and second via plugs 135a and 135b may include a metal (e.g., aluminum, aluminum compound, copper or copper compound) having substantially low resistivity. The first pads 150 having the first via contact portions 155 and the second pads 150 having the second via contact portions 165 may include a metal (e.g., aluminum, aluminum compound, copper or copper compound) having substantially low resistivity.

The first interconnection 130a and the second interconnection 130b may be formed (or provided) on the lower insulating layer 110 at the same height. In other example embodiments, the first and second interconnections may be formed (or disposed) at different heights. The first interconnections and the second interconnections may be formed (or provided) on different layers. A description thereof is provided below with reference to accompanying drawings.

Figure 4A:
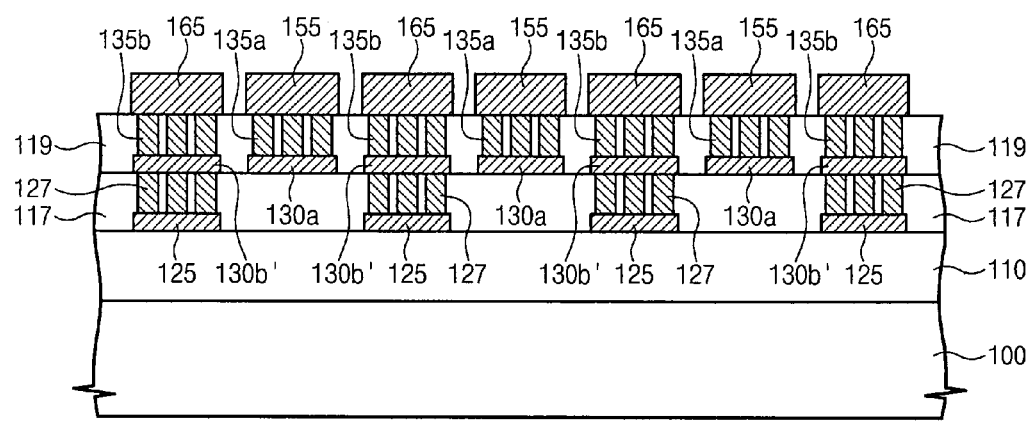
FIGS. 4A, 4B and 4C are diagrams illustrating sectional views taken along lines I-I', II-II', and III-III', respectively, of the semiconductor device shown in FIG. 2.
Figure 4B:
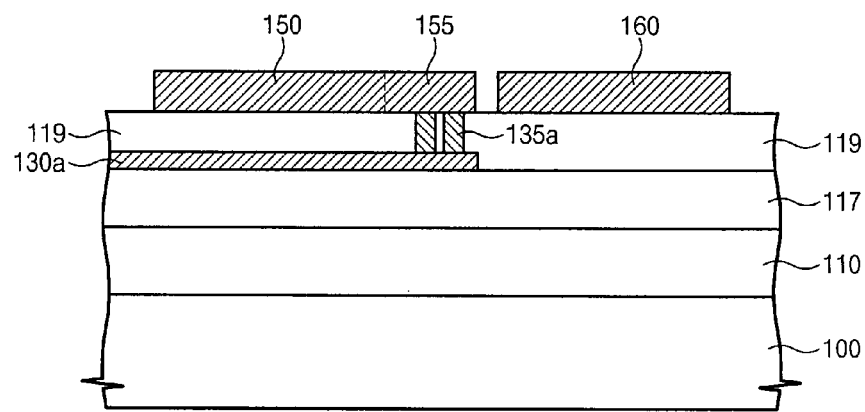
Figure 4C:
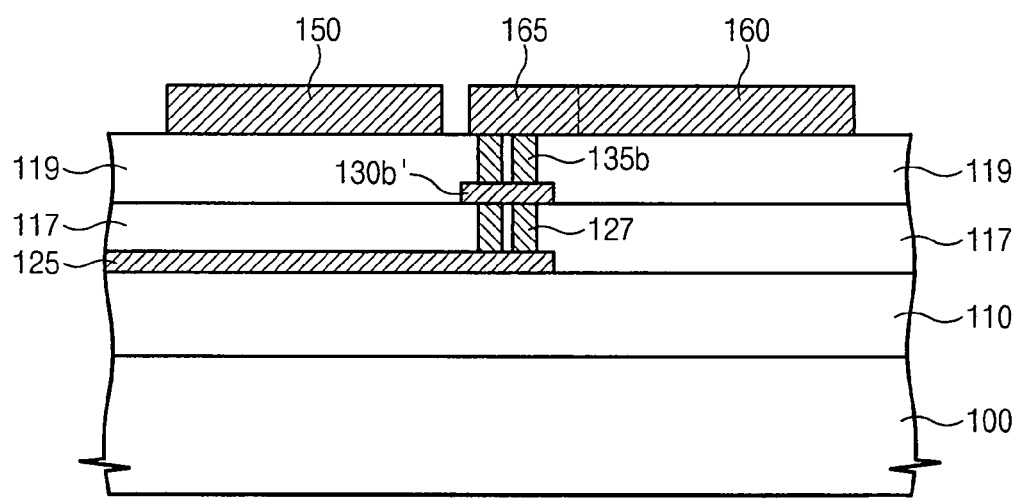

FIGS. 4A, 4B and 4C are diagrams illustrating sectional views taken along lines I-I', II-II', and III-III', respectively, of the semiconductor device shown in FIG. 2.

Referring to FIGS. 4A, 4B and 4C, in order to decrease an interference phenomenon between interconnections and/or an interference phenomenon between interconnections and pads, second interconnections 125 electrically connected to the second via contact portions 165 may be formed (or positioned) lower than (or below) the first interconnections 130a connected to the first via contact portions 155. In other example embodiments, the first interconnections 130a may be arranged lower than (or below) the second interconnections 125.

The second interconnections 125 may be formed (or disposed) on the lower insulating layer 110. The second interconnections 125 may be electrically connected to the second via contact portions 165. A lower interlayer dielectric layer 117 may be formed on (or covering) the surface of the second interconnections 125 and the substrate 100. The first interconnections 130a may be formed (or disposed) on the lower interlayer dielectric layer 117. A plurality of landing patterns 130b' may be formed (or disposed) on the lower interlayer dielectric layer 117. An upper interlayer dielectric layer 119 may be formed on (or covering) the surface of the first interconnections 130a, the landing patterns 130b', and the substrate 100. The second interconnections 125 extend below the landing patterns 130b'. At least one lower plug 127 passes through the lower interlayer dielectric layer 117 between one of the landing patterns 130b' and one of the second interconnections 125. The lower plug 127 electrically connects the second interconnection 125 to the landing pattern 130b'. A plurality of the lower plugs 127 may be formed (or provided) between one of the landing patterns 130b' and one of the second interconnections 125. In other example embodiments, one of the lower plugs 127 having a wide surface area may be formed (or provided) between one of the landing patterns 130b' and one of the second interconnections 125.

As shown in FIG. 4B, the first pads 150, the first via contact portions 155, the second pads 160, and the second via contact portions 165 may be formed (or provided) on the upper interlayer dielectric layer 119. The first pads 150, the via contact portions 155, the second pads 160, and the second via contact portions 165 are arranged as described above. The first interconnections 130a extend below the first via contact portions 155. The landing patterns 130b' may be formed (or provided) below the second via contact portions 165. At least one first via plug 135a passes through the upper interlayer dielectric layer 119 between one of the first via contact portions 155 and one of the first interconnections 130a. At least one second via plugs 135b passes through the upper interlayer dielectric layer 119 between one of the second via contact portions 165 and one of the landing patterns 130b'. The second via plugs 135b electrically connect the second via contact portions 165 to the landing patterns 130b'. The second via contact portions 165 may be electrically connected to the second interconnections 125 through the second via plugs 135b, the landing patterns 130b', and the lower plugs 127.

As described above, the first interconnections 130a and the second interconnections 125 may be arranged at different heights in order that an interference phenomenon (e.g., parasitic capacity) between the first and second interconnections 130a and 125 and/or an interference phenomenon between the interconnections 130a and 125 and the pads 150 and 160 decreases.

According to the example embodiments, via contact portions extending from pads and arranged in a traversing manner are shown. The via contact portions may have different shapes. The widths of the via contact portions connected to the pads may vary depending on the functions of the pads.

Figure 5:
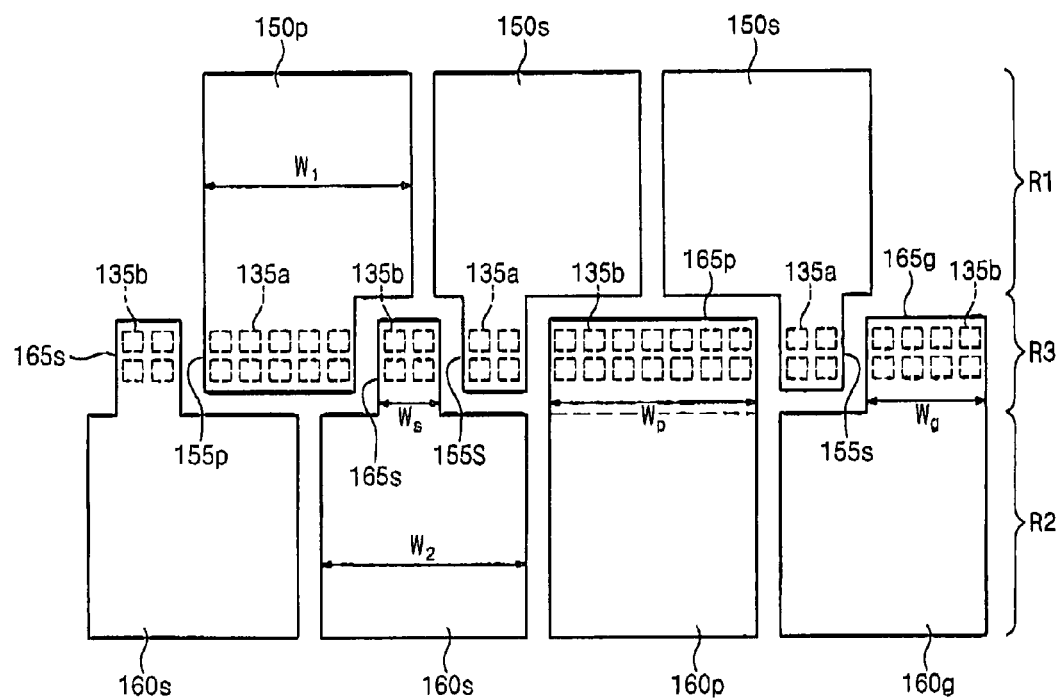

FIG. 5 is a diagram illustrating a plan view of a semiconductor device having pads according to example embodiments.

Referring to FIG. 5, an interlayer dielectric layer (not shown) formed on the substrate may be provided with a plurality of first pads 150p and 150s arranged along a first row R1. The first pads 150p and 150s may be arranged at equal intervals. The interlayer dielectric layer may be provided with a plurality of second pads 160p, 160s, and 160g arranged along a second row R2 parallel to the first row R1. A plurality of first via contact portions 155p and 155s may be laterally (or vertically) arranged and may extend horizontally from the first pads 150p and 150s, respectively, toward the second row R2. A plurality of second via contact portions 165p, 165s, and 165g may be laterally (or vertically) arranged and may extend horizontally from the second pads 160p, 160s, and 160g, respectively, toward the first row R1. The first and second via contact portions 155p, 155s, 165p, 165s, and 165g may be arranged along a third row R3 between the first row R1 and the second row R2.

The first and second pads 150p and 160p may be power pads. The first and second pads 150s and 160s may be signal pads. The second pad 160g may be a ground pad. A power voltage may be supplied externally to the semiconductor device through the power pads 150p and 160p. The signal pads 150s and 160s receive and/or output an electrical signal. A ground voltage may be supplied to the semiconductor device through the ground pad 160g.

Two groups of power pads 150p and 160p are shown in FIG. 5. However, example embodiments are not limited thereto. For example, the semiconductor device may have one power pad or at least three power pads. The power pads 150p may be referred to as first power pads. The power pads 160p may be referred to as second power pads. Four groups of signal pads 150s and 160s are shown in FIG. 5. The signal pads 150s may be referred to as first signal pads. The signal pads 160s may be referred to as second signal pads.

The first pads 150p and 150s each have a width $W_1$ that is parallel to the rows. The second pads 160p, 160s, and 160g each have a width $W_2$ that is parallel to the rows. The width $W_1$ of the first pads 150p and 150s may be identical to each other. The width $W_2$ of the second pads 160p, 160s, and 160g may be identical to each other. The width $W_1$ of the first pads 150p and 150s may be equal to the width $W_2$ of the second pads 160p, 160s and 160g.

The first and second via contact portions 155s and 165s connected to the first and second signal pads 150s and 160s, respectively, may have widths $W_s$ that are parallel to the rows. The width $W_s$ of the first and second via contact portions 155s and 165s connected to the first and second signal pads 150s and 160s may be narrower than the width $W_1$ of the first pads and the widths $W_2$ of the second pads. The width $W_s$ of the via contact portions 155s and 165s may be equal to each other. A width $W_p$ of the via contact portions 155p and 165p connected to the power pads 150p and 160p, respectively, may be wider than the width $W_s$ of the via contact portions 155s and 165s. The width $W_p$ of the via contact portions 155p and 165p may be equal to, or narrower than, the width $W_1$ of the power pads 150p and 160p.

As shown in FIG. 5, the width $W_p$ of the via contact portion 155p connected to the first power pad 150p may be wider than the width $W_s$ and narrower than the width $W_1$ of the power pad 150p. The width $W_p$ of the via contact portion 165p connected to the second power pad 160p may be equal to the width of the second power pad 160p. A width $W_g$ of the via contact portion 165g connected to the ground pad 160p may be wider than the width $W_s$ and parallel to the rows. The width $W_g$ of the via contact portion 165g may be equal to, or narrower, than a width of the ground pad 160g. The width $W_g$ of the via contact portions 165g may be equal to, or narrower than, the widths of the via contact portions 155p and 165p connected to the power pads 150p and 160p, respectively. The interval between a pair of the adjacent first pads 150p and 150s may be equal to, or narrower than, the interval between a pair of the adjacent via contact portions of the via contact portions 155p 155s 165p 165s, and 165g.

At least one first via plug 135a may be formed (or provided) in the interlayer dielectric layer (not shown) positioned below one of the via contact portion 155p or 155s. At least one second via plug 135b may be formed (or provided) in the interlayer dielectric layer positioned below one of the second via contact portions 165p, 165s or 165g.

A plurality of first interconnections (not shown) extend below the first via contact portions 155p and 155s. A plurality of second interconnections (not shown) may extend below the second via contact portions 165p, 165s, and 165g. One the first via contact portions 155p or 155s may be electrically connected to one of the first interconnections through at least one of the first via plugs 135a. One the second via contact portions 165p, 165s or 165g may be electrically connected to one of the second interconnections through at least one of the second via plugs 135b.

The first and second interconnections may be arranged at the same height, or different heights, according to example embodiments.

The via contact portions 155p, 155s, 165p, 165s and 165g connected to the first and second pads 150p, 150s, 160p, 160s and 160g may have different widths that vary according to the functions of the first and second pads 150p, 150s, 160p, 160s and 160g. In order to increase the functions of the pads 150p, 150s, 160p, 160s and 160g, the via contact portions 155p, 155s, 165p, 165s and 165g may be formed with different surface areas. For example, it is desirable to have a low contact resistance between the power pads 150p and 160p and the interconnections provided below the power pads 150p and 160p. As such, the widths of the via contact portions 155p and 165p connected to the power pads 150p and 160p may be increased, increasing the surface area of the via contact portions 155p and 160p. The number of via plugs provided below the via contact portions 155p and 165p, or the surface area of the via plugs 135a and 135b, may be increased so that the contact resistance between the power pads 150p and 160p and interconnections provided below the power pads 150p and 160p decreases.

In order to decrease the contact resistance between the ground pad 160g and an interconnections provided below the ground pad 160g, the width of the via contact portion 165g connected to the ground pad 160g may be increased. The width of the via contact portions 155s and 165s connected to the signal pads 150s and 160s, which are fairly insensitive to contact resistance, may be decreased. In order to decrease the surface area of the pads by arranging the first and second via contact portions 155p, 155s, 165p, 165s and 165g along one row and/or to have a more desirable pad arrangement, the first and second via contact portions 155p, 155s, 165p, 165s and 165g may be formed with different surface areas. The interval between the pads may be decreased. A semiconductor device according to example embodiments may be suitable for higher integration.

As described above, according to the example embodiments, a plurality of first via contact portions extending from a plurality of first pads arranged along a first row R1 and a plurality of second via contact portions extending from a plurality of second pads arranged along a second row R2 may be formed along a third row R3 between the first row R1 and the second row R2. The first and second via contact portions may be arranged along one row such that a desirable arrangement of the first and second pads having the first and second via contact portions is formed. As such, a surface area occupied by the pads having the via contact portions decreases, forming a more highly-integrated semiconductor device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
an interlayer dielectric layer formed on a surface of a substrate;
a plurality of first pads arranged on the interlayer dielectric layer along a first row;
a plurality of second pads arranged on the interlayer dielectric layer along a second row;
a plurality of first via contact portions extending from the first pads toward the second row;
a plurality of second via contact portions extending from the second pads toward the first row;
at least one first via plug arranged in the interlayer dielectric layer below each of the first via contact portions such that the at least one first via plug contacts one of the first via contact portions; and
at least one second via plug arranged in the interlayer dielectric layer below each of the second via contact portions such that the at least one second via plug contacts one of the second via contact portions,
wherein the first via contact portions and the second via contact portions are arranged along a third row between the first row and the second row,
the first pads and the second pads include a power pad supplying a power supply voltage, and a signal pad receiving and outputting an electrical signal,
one of the first or second via contact portions is connected to the signal pad and each of the via contact portions connected to the signal pad has a width smaller than a width of the signal pad,
the other of the first or second via contact portions is connected to the power pad and each of the via contact portions connected to the power pad has a width wider than the width of each via contact portion connected to the signal pad, and
the widths of the signal pad, the via contact portions connected to the signal pad and the via contact portions connected to the power pad are parallel to the first, second and third rows.

2. The semiconductor device of claim 1, wherein an interval between adjacent first pads is equal to or smaller than an interval between adjacent via contact portions of the first and second via contact portions.

3. The semiconductor device of claim 1, wherein:
at least one of the first via contact portions has a width smaller than a width of each first pad,
at least one of the second via contact portions has a width smaller than a width of each second pad, and
the widths of the at least one first via contact portion, the at least one second via contact portion, the first pads and the second pads are parallel to the first, second and third rows.

4. The semiconductor device of claim 3, wherein the first via contact portions have identical widths, and the second via contact portions have identical widths.

5. The semiconductor device of claim 1, wherein the width of each via contact portion connected to the power pad is equal to or smaller than a width of the power pad and the width of the power pad is parallel to the first, second and third rows.

6. The semiconductor device of claim 1, wherein the first pads and the second pads include a ground pad supplying a ground voltage and at least one of the first or second via contact portions is connected to the ground pad, and
a width of the via contact portion connected to the ground pad is parallel to the first, second and third rows and wider than the width of each via contact portion connected to the signal pad.

7. The semiconductor device of claim 1, wherein the first via contact portions and the second via contact portions are alternately arranged along the third row.

8. The semiconductor device of claim 1, wherein the first pads and the second pads are alternately arranged along the first and second rows in a zigzag manner.

9. The semiconductor device of claim 1, further comprising:
a plurality of first interconnections formed on the substrate and extending below each of the first via contact portions; and
a plurality of second interconnections formed on the substrate and extending below each of the second via contact portions,
wherein the interlayer dielectric layer is formed on the first and second interconnections, the first via plug provided below the first via contact portions is electrically connected to the first interconnections, and the second via plug provided below the second via contact portions is electrically connected to the second interconnections.

10. The semiconductor device of claim 9, wherein the first interconnections and the second interconnections are formed at an identical height relative to the surface of the substrate.

11. The semiconductor device of claim 9, wherein the first interconnections are formed at a different height than the second interconnections relative to the surface of the substrate.

12. A semiconductor device, comprising:
a plurality of first pads arranged on a substrate along a first row;
a plurality of second pads arranged on the substrate along a second row;
a plurality of first via contact portions extending from the first pads toward the second row; and
a plurality of second via contact portions extending from the second pads toward the first row,
wherein the first via contact portions and the second via contact portions are arranged along a third row between the first and second rows, and an interval between adjacent first pads is equal to or smaller than an interval between adjacent via contact portions of the first and second via contact portions,
the first pads and the second pads include a power pad supplying a power supply voltage, and a signal pad receiving and outputting an electrical signal,
one of the first or second via contact portions is connected to the signal pad and each of the via contact portions connected to the signal pad has a width smaller than a width of the signal pad,
the other of the first or second via contact portions is connected to the power pad and each of the via contact portions connected to the power pad has a width wider than each via contact portion connected to the signal pad, and the widths of the via contact portions connected to the signal pad, the via contact portions connected to the power pad and the signal pad are parallel to the first, second and third rows.

13. The semiconductor device of claim 12, wherein an interval between adjacent second pads is equal to or smaller than the interval between adjacent via contact portions of the first and second via contact portions.

14. The semiconductor device of claim 12, wherein:
each of the first via contact portions has a width smaller than a width of each first pad,
each of the second via contact portions has a width smaller than a width of each second pad, and
the widths of the first pads, the second pads, the first via contact portions and the second via contact portions are parallel to the first, second and third rows.

15. The semiconductor device of claim 14, wherein the first via contact portions have identical widths, and the second via contact portions have identical widths.

16. The semiconductor device of claim 12, wherein the width of each via contact portion connected to the power pad is equal to or smaller than a width of the power pad and the width of the power pad is parallel to the first, second and third rows.

17. The semiconductor device of claim 12, wherein the first pads and the second pads include a ground pad supplying a ground voltage, and at least one of the first and second via contact portions is connected to the ground pad,
each of the via contact portions connected to the ground pad has a width parallel to the first, second and third rows and wider than the width of each via contact portion connected to the signal pad, and
each via of the contact portions connected to the ground pad has a width equal to or smaller than the width of each via contact portion connected to the power pad.

18. The semiconductor device of claim 12, wherein the first via contact portions and the second via contact portions are alternately arranged along the third row.

* * * * *